United States Patent
Lim et al.

(10) Patent No.: US 11,437,975 B2
(45) Date of Patent: Sep. 6, 2022

(54) BULK ACOUSTIC RESONATOR AND FILTER DEVICE

(71) Applicant: Samsung Electro-Mechanics Co., Ltd., Suwon-si (KR)

(72) Inventors: Chang Hyun Lim, Suwon-si (KR); Tae Hun Lee, Suwon-si (KR); Yong Suk Kim, Suwon-si (KR); Moon Chul Lee, Suwon-si (KR); Sang Kee Yoon, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 186 days.

(21) Appl. No.: 16/939,344

(22) Filed: Jul. 27, 2020

(65) Prior Publication Data
US 2021/0075396 A1    Mar. 11, 2021

(30) Foreign Application Priority Data

Sep. 6, 2019  (KR) .................. 10-2019-0110915
Apr. 3, 2020  (KR) .................. 10-2020-0040836

(51) Int. Cl.
*H03H 9/13*   (2006.01)
*H03H 9/05*   (2006.01)
*H03H 9/02*   (2006.01)
*H03H 9/56*   (2006.01)
*H03H 9/17*   (2006.01)
*H03H 9/10*   (2006.01)

(52) U.S. Cl.
CPC ........ *H03H 9/132* (2013.01); *H03H 9/02118* (2013.01); *H03H 9/0514* (2013.01); *H03H 9/105* (2013.01); *H03H 9/173* (2013.01); *H03H 9/564* (2013.01)

(58) Field of Classification Search
CPC ...... H03H 9/132; H03H 9/0514; H03H 9/105; H03H 9/173; H03H 9/564; H03H 9/1014; H03H 9/02118; H03H 9/02; H03H 9/17; H03H 9/64
USPC ......................................... 333/133, 187, 188
See application file for complete search history.

(56) References Cited

U.S. PATENT DOCUMENTS

2008/0042780 A1   2/2008  Lee et al.
2018/0019725 A1   1/2018  Lim et al.
2020/0052674 A1*  2/2020  Jeong ................... H03H 9/0211

FOREIGN PATENT DOCUMENTS

KR      10-1238360 B1      3/2013
KR      10-2018-0008243 A  1/2018
KR      10-2019-0084008 A  7/2019

* cited by examiner

*Primary Examiner* — Rakesh B Patel
*Assistant Examiner* — Jorge L Salazar, Jr.
(74) *Attorney, Agent, or Firm* — NSIP Law

(57) ABSTRACT

A bulk acoustic resonator includes: a substrate; a first electrode disposed on the substrate; a piezoelectric layer disposed to cover at least a portion of the first electrode; a second electrode disposed to cover at least a portion of the piezoelectric layer; and an insertion layer disposed below a partial region of the piezoelectric layer. A thickness of the first electrode in an active region in which the first electrode, the piezoelectric layer, and the second electrode overlap one another is less than a thickness of a region outside the active region. An angle of inclination of an internal side surface of the insertion layer is different from an angle of inclination of an external side surface of the insertion layer.

19 Claims, 8 Drawing Sheets

BULK ACOUSTIC RESONATOR AND FILTER DEVICE

CROSS-REFERENCE TO RELATED APPLICATIONS

This application claims the benefit under 35 U.S.C. § 119(a) of Korean Patent Application No. 10-2019-0110915 and Korean Patent Application No. 10-2020-0040836, filed on Sep. 6, 2019 and Apr. 3, 2020, respectively, in the Korean Intellectual Property Office, the entire disclosures of which are incorporated herein by reference for all purposes.

BACKGROUND

1. Field

The following description relates to a bulk acoustic resonator.

2. Description of Related Art

Recently, technical interest in 5G communications has increased, and technology that may be implemented in a candidate band range of 5G communications has been developed.

A frequency band which can be implemented by a film bulk acoustic resonator (FBAR) is about 6 GHz or less. In the case of a bulk acoustic resonator that may be driven in a frequency band of 2-3 GHz, an electrode thickness and a piezoelectric layer thickness may be easily implemented. However, in the case of a bulk acoustic resonator that may be driven in a frequency band of 5 GHz, there may be significant difficulty in a manufacturing process and deterioration of performance may be anticipated.

Accordingly, a need exists for a structure that may reduce deterioration in performance of a bulk acoustic resonator that may be driven in a frequency band of 5 GHz. For example, a structure that may improve Q performance by smooth reflection of lateral waves and may reduce insertion loss occurring in connecting the bulk acoustic resonator to an external connection electrode may be advantageous.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk acoustic resonator includes: a substrate; a first electrode disposed on the substrate; a piezoelectric layer disposed to cover at least a portion of the first electrode; a second electrode disposed to cover at least a portion of the piezoelectric layer; and an insertion layer disposed below a partial region of the piezoelectric layer. A thickness of the first electrode in an active region in which the first electrode, the piezoelectric layer, and the second electrode overlap one another is less than a thickness of a region outside the active region. An angle of inclination of an internal side surface of the insertion layer is different from an angle of inclination of an external side surface of the insertion layer.

A width of the insertion layer may be 20 μm or less.

The angle of inclination of the internal side surface of the insertion layer may be 15° to 25°.

The angle of inclination of the internal side surface of the insertion layer may be greater than the angle of inclination of the external side surface of the insertion layer.

The insertion layer may be formed of any one of silicon oxide (SiO2), aluminum nitride (AlN), aluminum oxide (Al2O3), silicon nitride (Si3N4), manganese oxide (MgO), zirconium oxide (ZrO2), lead zirconate titanate (PZT), gallium arsenide (GaAs), hafnium oxide (HfO2), titanium oxide (TiO2), and zinc oxide (ZnO).

The bulk acoustic resonator may further include: an etch stop portion disposed between the substrate and the first electrode, and disposed around a cavity.

The bulk acoustic resonator may further include: a sacrificial layer disposed around the etch stop portion.

The bulk acoustic resonator may further include: a passivation layer disposed in a region excluding a part of each of the first electrode and the second electrode and covering the first electrode and the second electrode; and a metal pad connected to areas of the first electrode and the second electrode exposed from the passivation layer.

The bulk acoustic resonator may further include: a membrane layer forming a cavity with the substrate and including a portion of the first electrode disposed on the membrane layer.

The membrane layer may include a seed layer formed of aluminum nitride (AlN).

The insertion layer may be disposed on the lower electrode. The piezoelectric layer may include a curved portion disposed on the insertion layer and raised up to correspond to a thickness and shape of the insertion layer.

In another general aspect, a filter device includes: a substrate; a first electrode disposed on the substrate; a piezoelectric layer disposed to cover at least a portion of the first electrode; a second electrode disposed to cover at least a portion of the piezoelectric layer; an insertion layer disposed below a partial region of the piezoelectric layer; an etch stop portion disposed between the substrate and the first electrode and disposed around a cavity; a sacrificial layer disposed around the etch stop portion; a passivation layer disposed in a region excluding a part of each of the first electrode and the second electrode and covering the first electrode and the second electrode; a metal pad connected to areas of the first electrode and the second electrode exposed from the passivation layer; and a cap forming an internal space with the substrate and coupled to the substrate by an adhesive layer. A thickness of the first electrode in an active region in which the first electrode, the piezoelectric layer, and the second electrode overlap one another is less than a thickness of a region outside the active region. An angle of inclination of an internal side surface of the insertion layer is different from an angle of inclination of an external side surface of the insertion layer.

The filter device may further include an external connection electrode penetrating the substrate, and connected to the first electrode and the second electrode.

The filter device may further include an external connection electrode penetrating the cap and connected to the metal pad.

A width of the insertion layer may be 20 μm or less.

The angle of inclination of the internal side surface of the insertion layer may be 15° to 25°.

The angle of inclination of the internal side surface of the insertion layer may be greater than the angle of inclination of the external side surface of the insertion layer.

The insertion layer may be formed of any one of silicon oxide (SiO2), aluminum nitride (AlN), aluminum oxide (Al2O3), silicon nitride (Si3N4), manganese oxide (MgO), zirconium oxide (ZrO2), lead zirconate titanate (PZT), gallium arsenide (GaAs), hafnium oxide (HfO2), titanium oxide (TiO2), and zinc oxide (ZnO).

The insertion layer may be disposed on the lower electrode. The piezoelectric layer may include a curved portion disposed on the insertion layer and raised up to correspond to a thickness and shape of the insertion layer.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
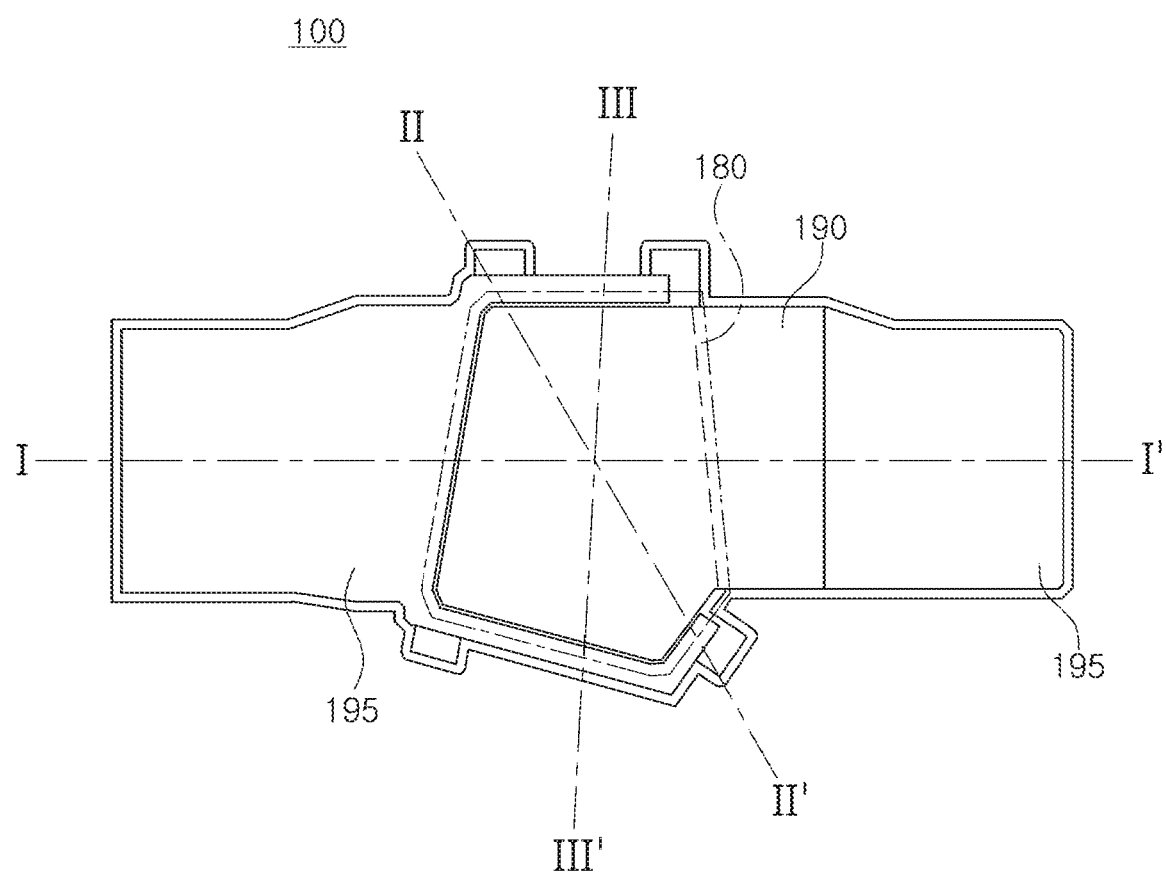
FIG. 1 is a plan diagram illustrating a bulk acoustic resonator, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," "lower," "front," "rear," and "side" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. For another example, if the device in the figures is turned around, an element described as being "front" relative to another element will then be "rear" relative to the other element. Thus, the term "front" encompasses both the front and rear orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
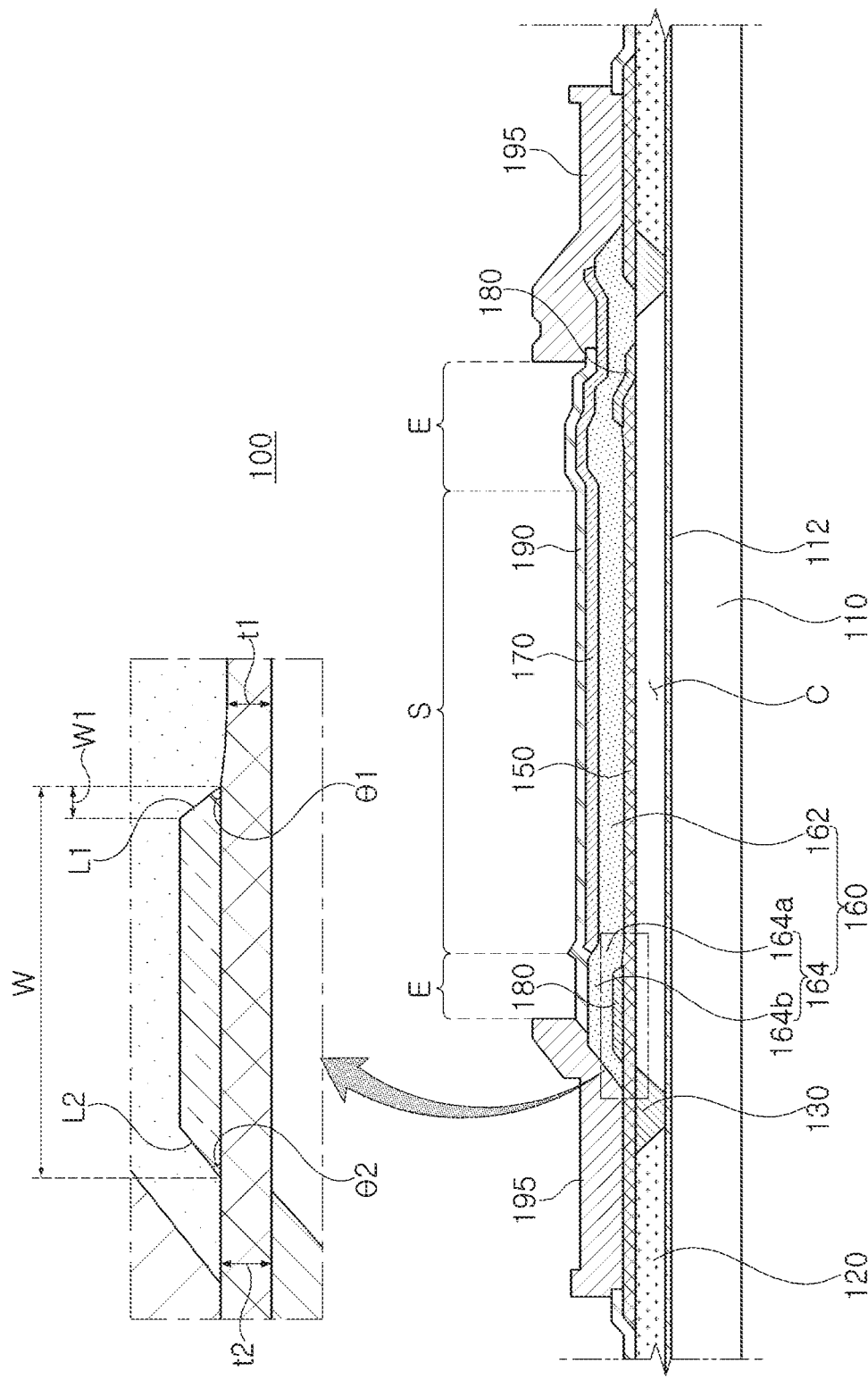
FIG. 2 is a cross-sectional diagram along line I-I' in FIG. 1, according to an embodiment.
Figure 3:
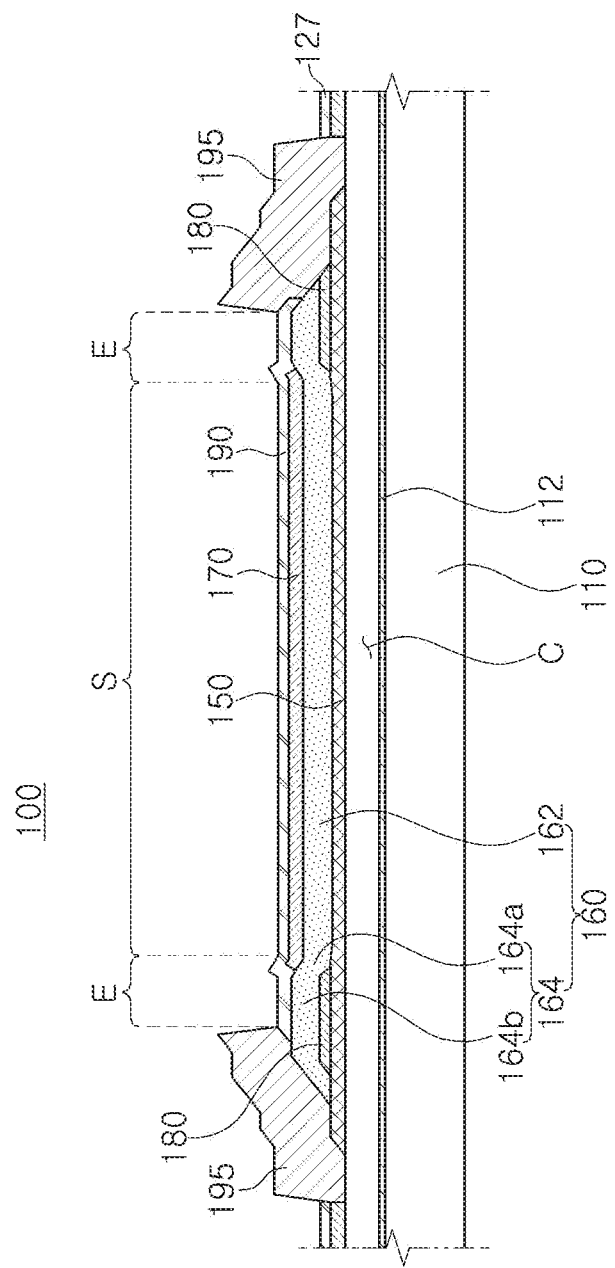
FIG. 3 is a cross-sectional diagram along line II-II' in FIG. 1, according to an embodiment.
Figure 4:
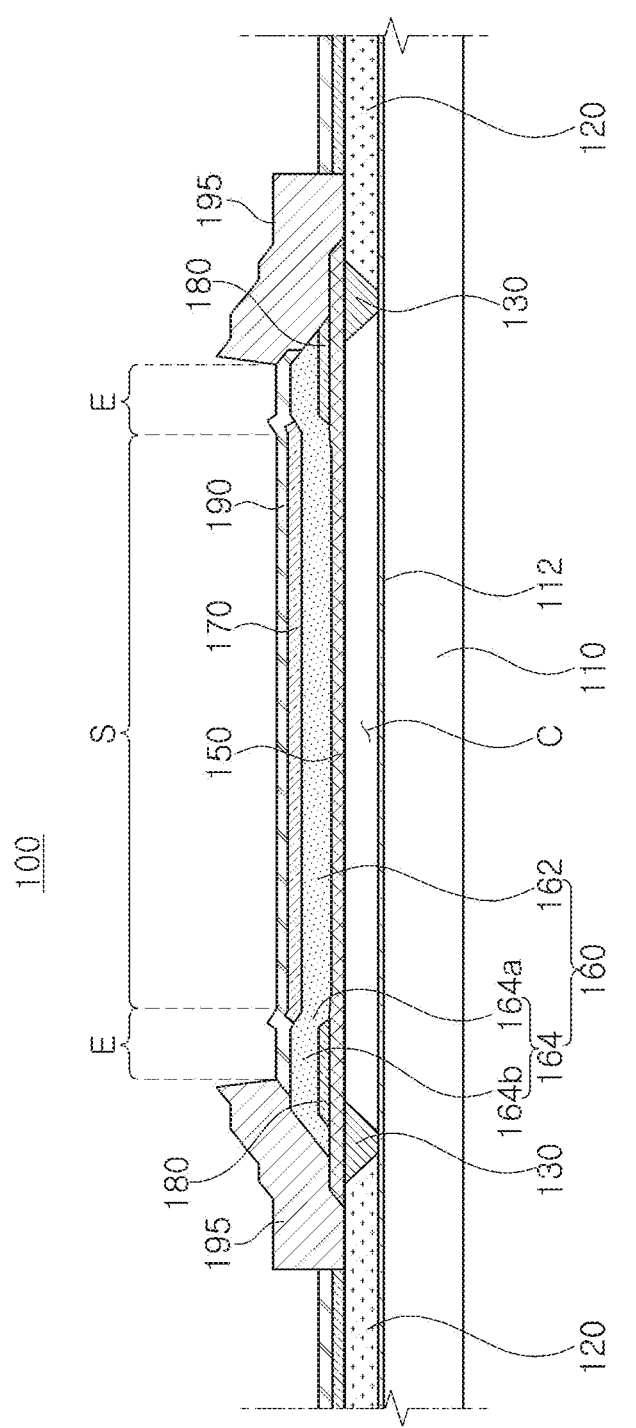
FIG. 4 is a cross-sectional diagram along line III-III' in FIG. 1, according to an embodiment.

FIG. 1 is a plan diagram illustrating a bulk acoustic resonator 100, according to an embodiment. FIG. 2 is a cross-sectional diagram along line I-I' in FIG. 1. FIG. 3 is a cross-sectional diagram along line II-II' in FIG. 1. FIG. 4 is a cross-sectional diagram along line III-III' in FIG. 1.

Referring to FIGS. 1 to 4, the bulk acoustic resonator 100 may include, for example, a substrate 110, a sacrificial layer 120, an etch stop portion 130, a first electrode 150, a piezoelectric layer 160, a second electrode 170, an insertion layer 180, a passivation layer 190, and a metal pad 195.

The substrate 110 may be a silicon substrate. For example, the substrate 110 may be formed by a silicon wafer or a silicon-on-insulator (SOI) type substrate.

An insulating layer 112 may be formed on an upper surface of the substrate 110, and the insulating layer 112 may electrically isolate the element(s) disposed on an upper surface of the substrate 110 from the substrate 110. Also, when the cavity C is formed over the insulating layer 112 in a manufacturing process, the insulating layer 112 may prevent the substrate 110 from being etched by an etching gas. In an example, the insulating layer 112 may be formed of any one or any combination of any two or more of silicon oxide ($SiO_2$), silicon nitride ($Si_3N_4$), aluminum oxide ($Al_2O_3$), and aluminum nitride (AlN), and may be formed through any one of a chemical vapor deposition process, an RF magnetron sputtering process, and an evaporation process.

The sacrificial layer 120 may be formed on the insulating layer 112, and the cavity C and the etch stop portion 130 may be disposed on an internal side of the sacrificial layer 120. The cavity C may be formed by removing a portion of the sacrificial layer 120 in a manufacturing process. As the cavity C is formed on an internal side of the sacrificial layer 120, the first electrode 150 and additional layers disposed on the sacrificial layer 120 may be disposed evenly (e.g., in a substantially flat or planar form).

The etch stop portion 130 may be disposed along a lateral/side boundary of the cavity C. The etch stop portion 130 may prevent etching beyond a cavity region in the process of forming the cavity C.

The first electrode 150 may be disposed on a membrane layer, and a portion of the first electrode 150 may be disposed on the cavity C. The first electrode 150 may be configured as either one of an input electrode and an output electrode that inputs or outputs, respectively, an electrical signal such as a radio frequency (RF) signal, and the like.

The first electrode 150 may be formed of a conductive material such as molybdenum (Mo) or an alloy of molybdenum (Mo), for example. However, the first electrode 150 is not limited to these examples. The first electrode 150 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or an alloy of ruthenium (Ru), tungsten (W), iridium (Ir), platinum (Pt), copper (Cu), titanium (Ti), tantalum (Ta), nickel (Ni), or chromium (Cr).

A thickness t1 of a portion of the first electrode 150 disposed in an active region may be less than a thickness t2 of a portion of the first electrode 150 disposed on an external side of the insertion layer 180.

An active region may be a region in which the first electrode 150, the piezoelectric layer 160, and the second electrode 170 overlap one another.

The piezoelectric layer 160 may be configured to cover at least a portion of the first electrode 150 disposed on the cavity C. The piezoelectric layer 160 may be a layer that generates a piezoelectric effect of converting electrical energy into mechanical energy having an elastic wave form, and may be formed of any one of aluminum nitride (AlN), zinc oxide (ZnO), and lead zirconate titanate (PZT; $PbZr$-$TiO$). In an example in which the piezoelectric layer 160 is formed of aluminum nitride (AlN), the piezoelectric layer 160 may further include a rare earth metal. As an example, the rare earth metal may include any one or any combination of any two or more of scandium (Sc), erbium (Er), yttrium (Y), and lanthanum (La). Also, as an example, a transition metal may include any one of titanium (Ti), zirconium (Zr), hafnium (Hf), tantalum (Ta), and niobium (Nb). Also, magnesium (Mg), which is a divalent metal, may be included.

The piezoelectric layer 160 may include a piezoelectric portion 162 disposed in a planar portion S, and a curved portion 164 disposed in an extension portion E.

The piezoelectric portion 162 may be stacked directly on an upper surface of the first electrode 150. Accordingly, the piezoelectric portion 162 may be interposed between the first electrode 150 and the second electrode 170 and may be formed evenly (e.g., substantially flat) with the first electrode 150 and the second electrode 170.

The curved portion 164 may be a region extending from the piezoelectric portion 162 to an external side of the piezoelectric layer 160 and disposed in the extension portion E.

The curved portion 164 may be disposed on the insertion layer 180, and may be raised up along a shape of the insertion layer 180. Accordingly, the piezoelectric layer 160 may be bent at a boundary between the piezoelectric portion 162 and the curved portion 164, and the curved portion 164 may be raised up to correspond to a thickness and a shape of the insertion layer 180.

The curved portion 164 may include an inclined portion 164a and an extended portion 164b.

The inclined portion 164a may be a portion inclined along a first inclined surface L1 of the insertion layer 180. The extended portion 164b may refer to a portion extending from the inclined portion 164a to the external side of the piezoelectric layer 160.

The inclined portion 164a may be formed to be parallel to the inclined surface L, and an angle of inclination of the first inclined surface L1 may be the same as an angle of inclination 81 of the first inclined surface L1 of the insertion layer 180.

The second electrode 170 may cover at least the portion of the piezoelectric layer 160 disposed on the cavity C. The second electrode 170 may be configured as either one of an input electrode and an output electrode that inputs or outputs, respectively, an electrical signal such as a radio frequency (RF) signal. In an example in which the first electrode 150 is configured as an input electrode, the second electrode 170 may be configured as an output electrode. In an example in which the first electrode 150 is configured as an output electrode, the second electrode 170 may be configured as an input electrode.

The second electrode 170 may be formed using a conductive material such as molybdenum (Mo) or an alloy of molybdenum (Mo), for example. However, the second electrode 170 is not limited to these examples. The second electrode 170 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or an alloy of ruthenium (Ru), tungsten (W), iridium (Ir), platinum (Pt), copper (Cu), titanium (Ti), tantalum (Ta), nickel (Ni), of chromium (Cr).

The insertion layer 180 may be disposed between the first electrode 150 and the piezoelectric layer 160. The insertion layer 180 may be formed using a dielectric material such as silicon oxide ($SiO_2$), aluminum nitride (AlN), aluminum oxide ($Al_2O_3$), silicon nitride ($Si_3N_4$), manganese oxide (MgO), zirconium oxide (ZrO$_2$), lead zirconate titanate (PZT), gallium arsenide (GaAs), hafnium oxide (HfO$_2$), titanium oxide (TiO$_2$), zinc oxide (ZnO), or the like, and may be formed of a material different from that of the piezoelectric layer 160.

At least a portion of the insertion layer 180 may be disposed between the piezoelectric layer 160 and the first electrode 150. As an example, the insertion layer 180 may have a ring shape.

The first inclined surface L1 having a first inclination angle θ1 may be disposed on an internal side surface of the insertion layer 180. The insertion layer 180 may also include a second inclined surface L2 having a second inclination angle θ2, and disposed on an external side surface of the insertion layer 180. The first inclination angle θ1 may be 15°-25°. The second inclination angle θ2 may be different from the first inclination angle θ1.

In a process of forming the insertion layer 180, a dielectric layer may be layered to cover the first electrode 150 after layering the first electrode 150. Thereafter, a PR pattern may be layered on the dielectric layer to form the insertion layer 180. A portion of the dielectric layer disposed in the active region may be removed by a primary etching process. The removing of the portion of dielectric layer may be performed by an over-etching process to completely remove a thickness of the dielectric layer in an etched region. Accordingly, the first electrode 350 may be partially removed by the etching process. Accordingly, the thickness t1 of the portion of the first electrode 150 disposed in the active region may be thinner than the thickness t2 of the portion of the first electrode 150 disposed in the region outside the active region. Accordingly, the first inclined surface L1 of the insertion layer 180 may be formed by the primary etching process. Thereafter, a second etching process may be performed to remove an edge of the dielectric layer. The edge of the dielectric layer may be removed by a lower level of etching than the over-etching of the primary etching process.

Accordingly, as an amount of the first electrode 150 etched by the secondary etching process may decrease, degradation of insertion loss properties may be prevented. In other words, the reduction of the thickness of the first electrode 150 may decrease in a region in which an external connection electrode 220 (of FIG. 6) is connected to the first electrode 150 such that degradation of insertion loss properties may be prevented.

As an example, the insertion layer 180 may have a width of 20 μm or less.

Figure 5:
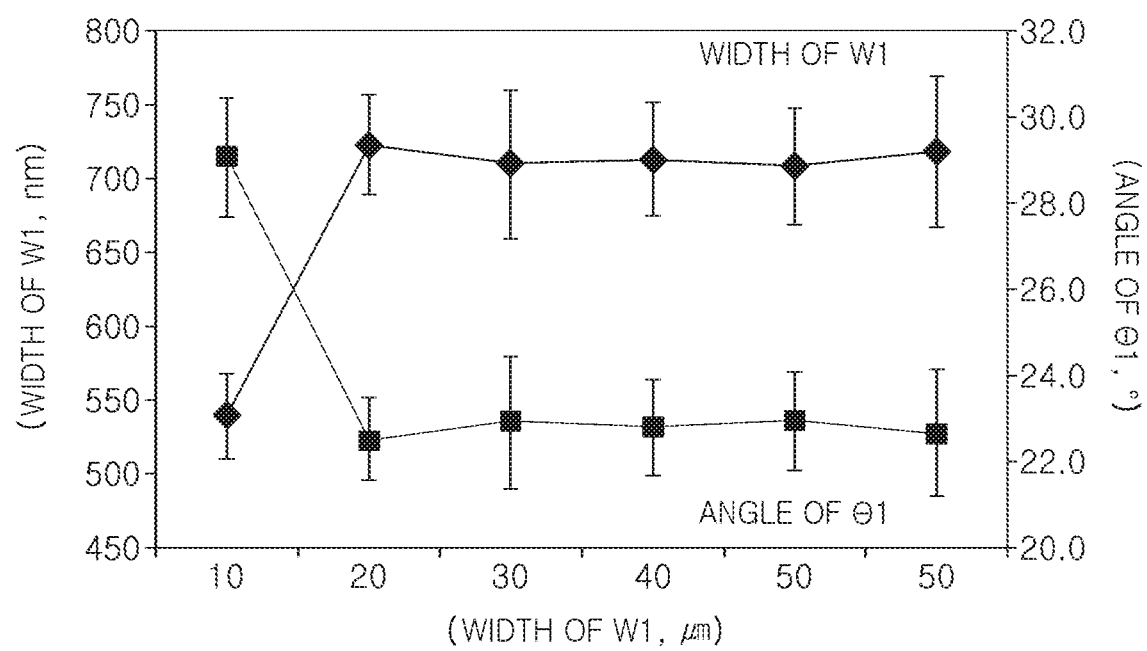
FIG. 5 is a graph indicating a width of a first inclined surface according to an overall width of an insertion layer, and a first angle of inclination, according to an embodiment.

As illustrated in FIG. 5, it has been demonstrated that, when the insertion layer 180 is formed by a general technique and an overall width W of the insertion layer 180 is less than 20 μm, the first inclination angle θ1 may rapidly increase, and a width of the first inclined surface L1 may rapidly decrease.

Accordingly, in an embodiment in which an overall width of the insertion layer 180 is 20 μm or less, a region disposed in an active region when the insertion layer 180 is formed may be removed by a primary etching process, and a region disposed on an external side of the insertion layer 180 may be removed by a secondary etching process. Accordingly, the first inclination angle θ1 may be implemented to be 15°-25° and the reduction of the thickness of the first electrode 150 may decrease in a region in which the external connection electrode is connected to the first electrode 150.

The passivation layer 190 may be formed on a region excluding a portion of each of the first electrode 150 and the second electrode 170. The passivation layer 190 may prevent the first electrode 150 and the second electrode 170 from being damaged in a manufacturing process of the bulk acoustic resonator 100.

A dielectric layer containing any one of silicon nitride (Si$_3$N$_4$), silicon oxide (SiO$_2$), manganese oxide (MgO), zirconium oxide (ZrO$_2$), aluminum nitride (AlN), lead zirconate titanate (PZT), gallium arsenide (GaAs), hafnium oxide (HfO$_2$), aluminum oxide (Al$_2$O$_3$), titanium oxide (TiO$_2$), and zinc oxide (ZnO) may be used to form the passivation layer 190, for example.

The metal pad 195 may be formed on a portion of each of the first electrode 150 and the second electrode 170 on which the passivation layer 190 is not formed. As an example, the metal pad 195 may be formed of a material such as gold (Au), a gold-tin (Au—Sn) alloy, copper (Cu), a copper-tin (Cu—Sn) alloy, and aluminum (Al), or an aluminum alloy. For example, the aluminum alloy may be an aluminum-germanium (Al—Ge) alloy.

As described above, the first inclination angle θ1 may be 15°-25° and the reduction of the thickness of the first electrode 150 may decrease in a region in which the external connection electrode is connected to the first electrode 150. Accordingly, Q performance may improve and degradation of insertion loss properties may be prevented.

Figure 6:
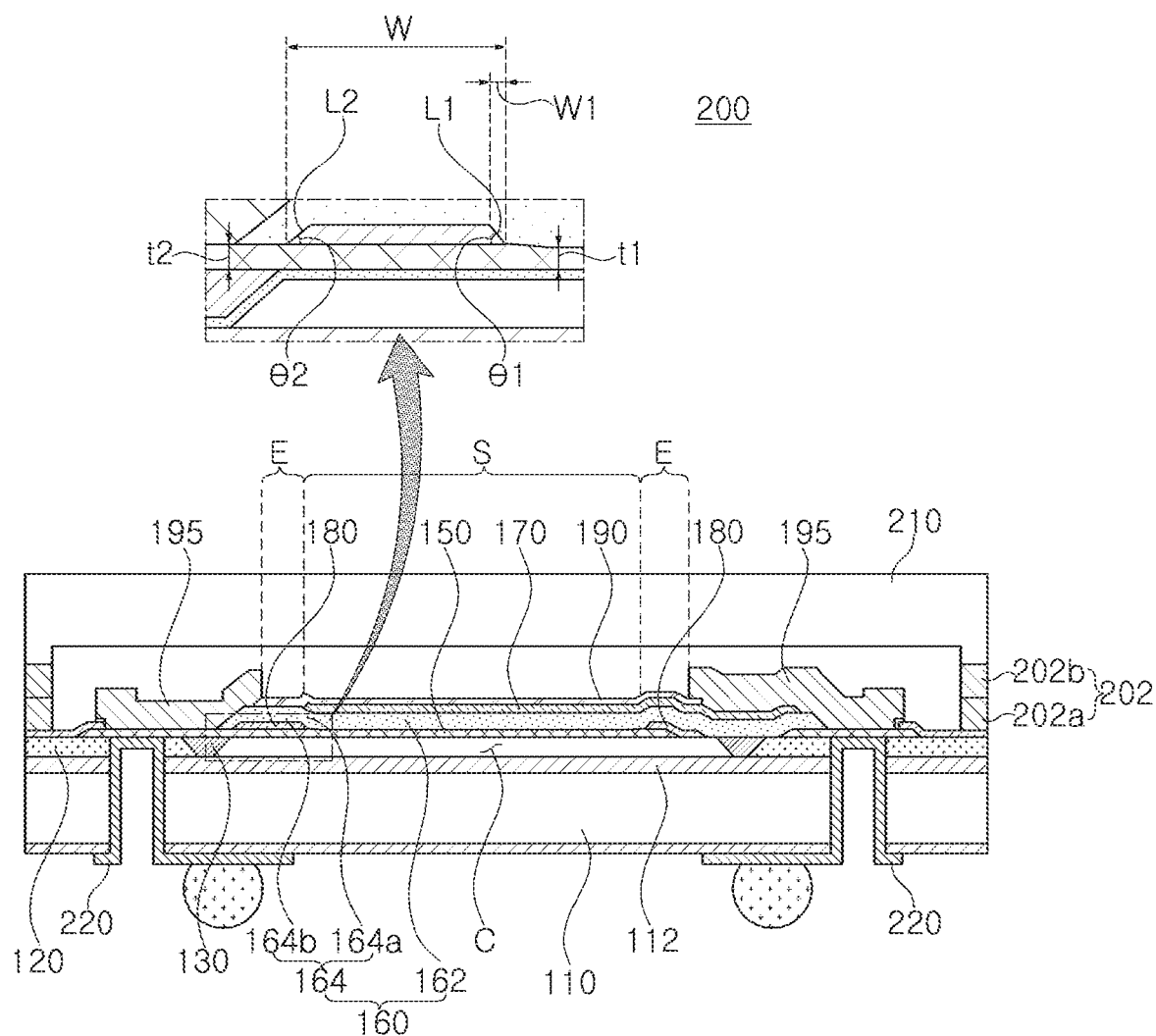
FIG. 6 is a cross-sectional diagram illustrating a filter device, according to an embodiment.

FIG. 6 is a cross-sectional diagram illustrating a filter device 200, according to an embodiment.

Referring to FIG. 6, the filter device 200 may include, for example, a substrate 110, a sacrificial layer 120, an etch stop portion 130, a first electrode 150, a piezoelectric layer 160, a second electrode 170, an insertion layer 180, a passivation layer 190, a metal pad 195, and a cap 210.

The substrate 110, the sacrificial layer 120, the etch stop portion 130, the first electrode 150, the piezoelectric layer 160, the second electrode 170, the insertion layer 180, the passivation layer 190, and the metal pad 195 may be the same as described in the aforementioned embodiment, and detailed descriptions of these elements will thus not be repeated.

The cap 210 may form an internal space with the substrate 110 and may be mounted on the substrate 110 by an adhesive layer 202. The cap 210 may be formed of a material containing silicon (Si), for example.

The adhesive layer 202 may include a first adhesive layer 202a attached to the substrate 110 and a second adhesive layer 202b attached to the first adhesive layer 202a and the cap 210. The first and second adhesive layers 202a and 202b may be formed of a material containing any one or any combination of any two or more of gold (Au), tin (Sn), chromium (Cr), titanium (Ti), and aluminum (Al).

The filter device 200 may include an external connection electrode 220 penetrating (e.g., extending through) the substrate 110, and electrically connected to the first electrode 150 and the second electrode 170.

Figure 7:
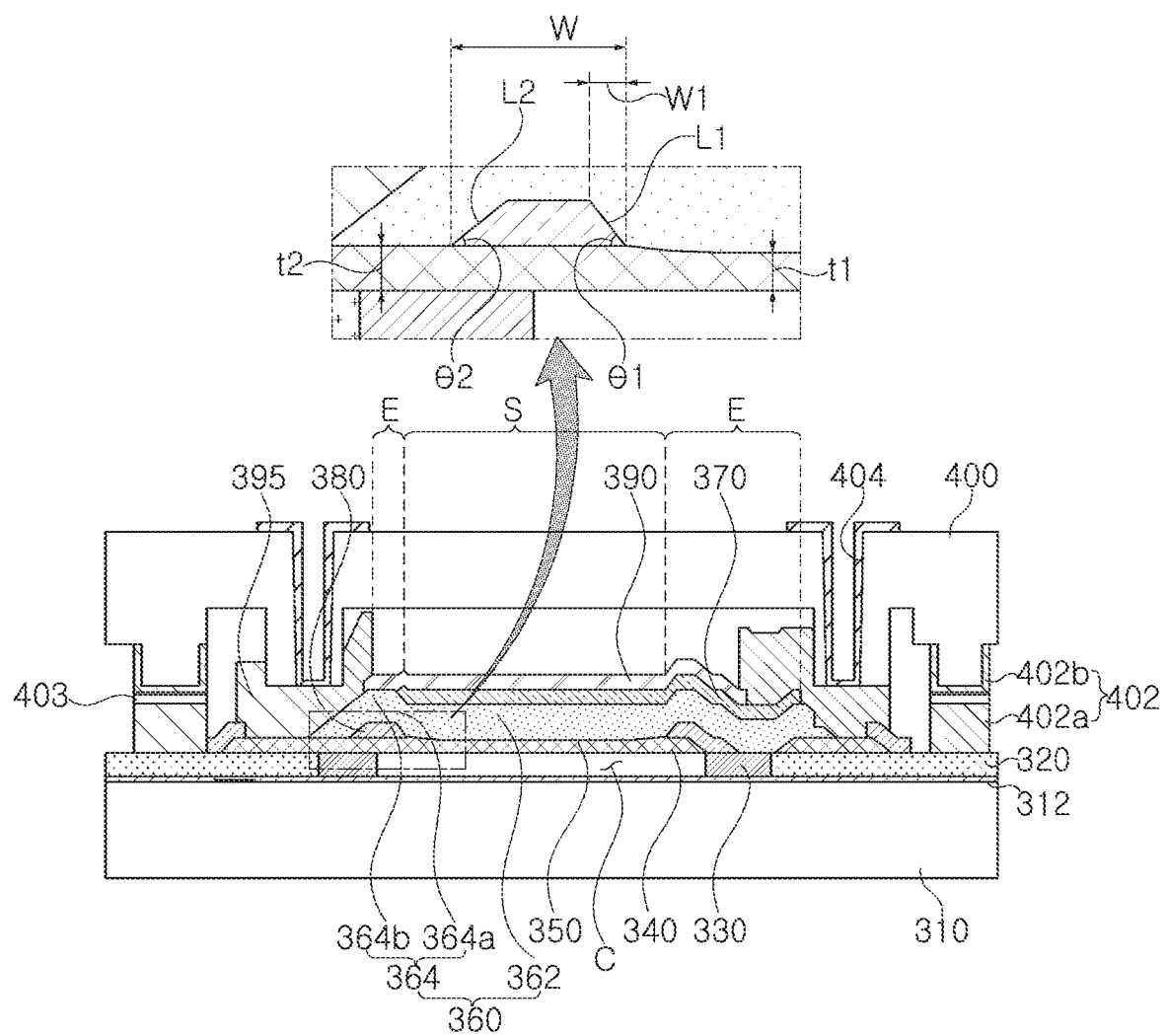
FIG. 7 is a cross-sectional diagram illustrating a filter device, according to an embodiment.

FIG. 7 is a cross-sectional diagram illustrating a filter device 300, according to an embodiment.

Referring to FIG. 7, the filter device 300 may include, for example, a substrate 310, a sacrificial layer 320, an etch stop portion 330, a first electrode 350, a piezoelectric layer 360, a second electrode 370, an insertion layer 380, a passivation layer 390, a metal pad 395, and a cap 400.

The substrate 310 may be a silicon substrate. For example, the substrate 310 may be formed by a silicon wafer or a silicon-on-insulator (SOI) type substrate.

An insulating layer 312 may be formed on an upper surface of the substrate 310, and the insulating layer 312 may electrically isolate the element(s) disposed on an upper surface of the substrate 310 from the substrate 310. Also, when the insulating layer 312 forms the cavity C in a manufacturing process, the insulating layer 312 may prevent the substrate 310 from being etched by an etching gas.

In an example, the insulating layer 312 may be formed of any one or any combination of any two or more of silicon oxide ($SiO_2$), silicon nitride ($Si_3N_4$), aluminum oxide ($Al_2O_3$), and aluminum nitride (AlN), and may be formed through one any of a chemical vapor deposition process, an RF magnetron sputtering process, and an evaporation process.

The sacrificial layer 320 may be formed on the insulating layer 312, and the cavity C and the etch stop portion 330 may be disposed on an internal side of the sacrificial layer 320. The cavity C may be formed by partially removing the sacrificial layer 320 in a manufacturing process. As the cavity C is formed on an internal side of the sacrificial layer 320, the first electrode 350, and the like, disposed on the sacrificial layer 320, may be disposed evenly (e.g., in a substantially flat or planar form).

The etch stop portion 330 may be disposed along a side/lateral boundary of the cavity C. The etch stop portion 330 may prevent etching beyond a cavity region in a process of forming the cavity C.

A portion of the first electrode 350 may be disposed on the cavity C. The first electrode 350 may be configured as either one of an input electrode and an output electrode that inputs or outputs, respectively, an electrical signal such as a radio frequency (RF) signal, and the like.

The first electrode 350 may be formed of a conductive material such as molybdenum (Mo) or an alloy of molybdenum (Mo), for example. However, the first electrode is not limited to these examples. The first electrode 350 may be formed of a conductive material such as ruthenium (Ru), tungsten (W), iridium (Ir), platinum (Pt), copper (Cu), titanium (Ti), tantalum (Ta), nickel (Ni), or chromium (Cr), or an alloy of ruthenium (Ru), tungsten (W), iridium (Ir), platinum (Pt), copper (Cu), titanium (Ti), tantalum (Ta), nickel (Ni), or chromium (Cr).

A thickness t1 of a portion of the first electrode 350 disposed in an active region may be less than a thickness t2 of a portion of the first electrode 350 disposed on an external side of the insertion layer 380.

The piezoelectric layer 360 may be configured to cover at least a portion of the first electrode 350 disposed on the cavity C. The piezoelectric layer 360 may be a layer that generates a piezoelectric effect of converting electrical energy into mechanical energy having an elastic wave form, and may be formed of any one of aluminum nitride (AlN), zinc oxide (ZnO), and lead zirconate titanate (PZT; PbZrTiO). In an example in which the piezoelectric layer 360 is formed of aluminum nitride (AlN), the piezoelectric layer 360 may further include a rare earth metal. As an example, the rare earth metal may include any one or any combination of any two or more of scandium (Sc), erbium (Er), yttrium (Y), and lanthanum (La). Also, as an example, the transition metal may include any one of titanium (Ti), zirconium (Zr), hafnium (Hf), tantalum (Ta), and niobium (Nb). Also, magnesium (Mg), which is a divalent metal, may be included.

The piezoelectric layer 360 may include a piezoelectric portion 362 disposed in a planar portion S, and a curved portion 364 disposed in an extension portion E.

The piezoelectric portion 362 may be directly stacked on an upper surface of the first electrode 350. Accordingly, the piezoelectric portion 362 may be interposed between the first electrode 350 and the second electrode 370, and may be formed evenly (e e.g., in a substantially flat or planar form) with the first electrode 350 and the second electrode 370.

The curved portion 364 may be a region extending from the piezoelectric portion 362 to an external side of the piezoelectric layer 360 and disposed in the extension portion E.

The curved portion 364 may be disposed on the insertion layer 380, and may be configured to be raised up along a shape of the insertion layer 380. Accordingly, the piezoelectric layer 360 may be bent at a boundary between the piezoelectric portion 362 and the curved portion 364, and the curved portion 364 may be raised up to correspond to a thickness and a shape of the insertion layer 380.

The curved portion 364 may include an inclined portion 364a and an extended portion 364b.

The inclined portion 364a may be a portion inclined along an inclined surface of the insertion layer 380. The extended portion 364b be a portion extending from the inclined portion 364a to the external side of the piezoelectric layer 360.

The inclined portion 364a may be formed to be parallel to an inclined surface of the insertion layer 380, and an angle of inclination of the inclined portion 364a may be the same as an angle of inclination of an inclined surface of the insertion layer 380.

The second electrode 370 may cover at least a portion of the piezoelectric layer 360 disposed on the cavity C. The second electrode 370 may be configured as either one of an input electrode and an output electrode that inputs or outputs, respectively, an electrical signal such as a radio frequency (RF) signal. When the first electrode 350 is configured as an input electrode, the second electrode 370 may be configured as an output electrode. When the first electrode 350 is configured as an output electrode, the second electrode 370 may be configured as an input electrode.

The second electrode 370 may be formed of a conductive material such as molybdenum (Mo) or an alloy of molybdenum (Mo), for example. However, the second electrode 370 is not limited to these examples. The second electrode 370 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or an alloy of ruthenium (Ru), tungsten (W), iridium (Ir), platinum (Pt), copper (Cu), titanium (Ti), tantalum (Ta), nickel (Ni), or chromium (Cr).

The insertion layer 380 may be disposed between the first electrode 350 and the piezoelectric layer 360. The insertion layer 380 may be formed of a dielectric material such as silicon oxide ($SiO_2$), aluminum nitride (AlN), aluminum oxide ($Al_2O_3$), silicon nitride ($Si_3N_4$), manganese oxide (MgO), zirconium oxide ($ZrO_2$), lead zirconate titanate (PZT), gallium arsenide (GaAs), hafnium oxide ($HfO_2$), titanium oxide ($TiO_2$), zinc oxide (ZnO), or the like, and may be formed of a material different from that of the piezoelectric layer 360.

At least a portion of the insertion layer 380 may be disposed between the piezoelectric layer 360 and the first electrode 350. As an example, the insertion layer 380 may have a ring shape.

A first inclined surface L1 having a first inclination angle $\theta 1$ may be disposed on an internal side surface of the insertion layer 380, and a second inclined surface L2 having a second inclination angle $\theta 2$ may be disposed on an external side surface of the insertion layer 380. The first inclination angle $\theta 1$ may be 15°-25°. The second inclination angle $\theta 2$ may have an angle different from that of the first inclination angle $\theta 1$.

In a process of forming the insertion layer 380, a dielectric layer may be layered to cover the first electrode 350 after layering the first electrode 350. Thereafter, a PR pattern may be layered on the dielectric layer to form the insertion layer 380. A portion of the dielectric layer disposed in the active region may be removed by a primary etching process. The removing of the portion of the dielectric layer may be performed by an over-etching process to completely remove a thickness of the dielectric layer in an etched region. Accordingly, the first electrode 350 may be partially removed by the etching process. Accordingly, the thickness t1 of the portion of the first electrode 350 disposed in the active region may become thinner than the thickness t2 the portion of the first electrode 350 disposed in a region outside the active region. Accordingly, the first inclined surface L1 of the insertion layer 380 may be formed by the primary etching process. Thereafter, a second etching process may be performed to remove an edge of the dielectric layer. The edge of the dielectric layer may be removed by a lower level of etching than the over-etching of the primary etching process. Accordingly, the etching of the first electrode 350 may be reduced by the secondary etching process.

Accordingly, as an amount of the first electrode 350 etched by the secondary etching process may decrease, degradation of insertion loss properties may be prevented. In other words, a reduction of a thickness of the first electrode 350 may decrease in a region in which a metal pad 395 is connected to the first electrode 350 such that degradation of insertion loss properties may be prevented.

As an example, the insertion layer 380 may have a width of 20 μm or less.

The passivation layer 390 may be formed in a region excluding a portion of each of the first electrode 350 and the second electrode 370. The passivation layer 390 may prevent the first electrode 350 and the second electrode 370 from being damaged in a manufacturing process.

A dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) may be used to form the passivation layer 390, for example.

The metal pad 395 may be formed in a portion of each of the first electrode 350 and the second electrode 370 in which the passivation layer 390 is not formed. As an example, the metal pad 395 may be formed of a material such as gold (Au), a gold-tin (Au—Sn) alloy, copper (Cu), a copper-tin (Cu—Sn) alloy, and aluminum (Al), or an aluminum alloy. For example, the aluminum alloy may be an aluminum-germanium (Al—Ge) alloy.

The cap 400 may form an internal space with the substrate 310 and may be installed on a substrate 310 through an adhesive layer 402. The cap 400 may be formed of a material containing silicon (Si).

The adhesive layer 402 may include a first adhesive layer 402a attached to the substrate 310 and a second adhesive layer 402b attached to the first adhesive layer 402a and the cap 410. The first and second adhesive layers 402a and 402b may be formed of a material containing any one or any combination of any two or more of gold (Au), tin (Sn), chromium (Cr), titanium (Ti), and aluminum (Al).

As an example, a sealing layer 403 may be disposed between the first and second adhesive layers 402a and 402b.

An external connection electrode 404 penetrating (e.g., extending through) the cap 400 may be disposed in the cap 400 to be connected to the metal pad 395.

As described above, the first inclination angle θ1 may be implemented to be 15°-25° and the reduction of the thickness of the first electrode 350 may decrease in a region in which the metal pad 395 is connected to the first electrode 350. Accordingly, Q performance may improve and degradation of insertion loss properties may be prevented.

Figure 8:
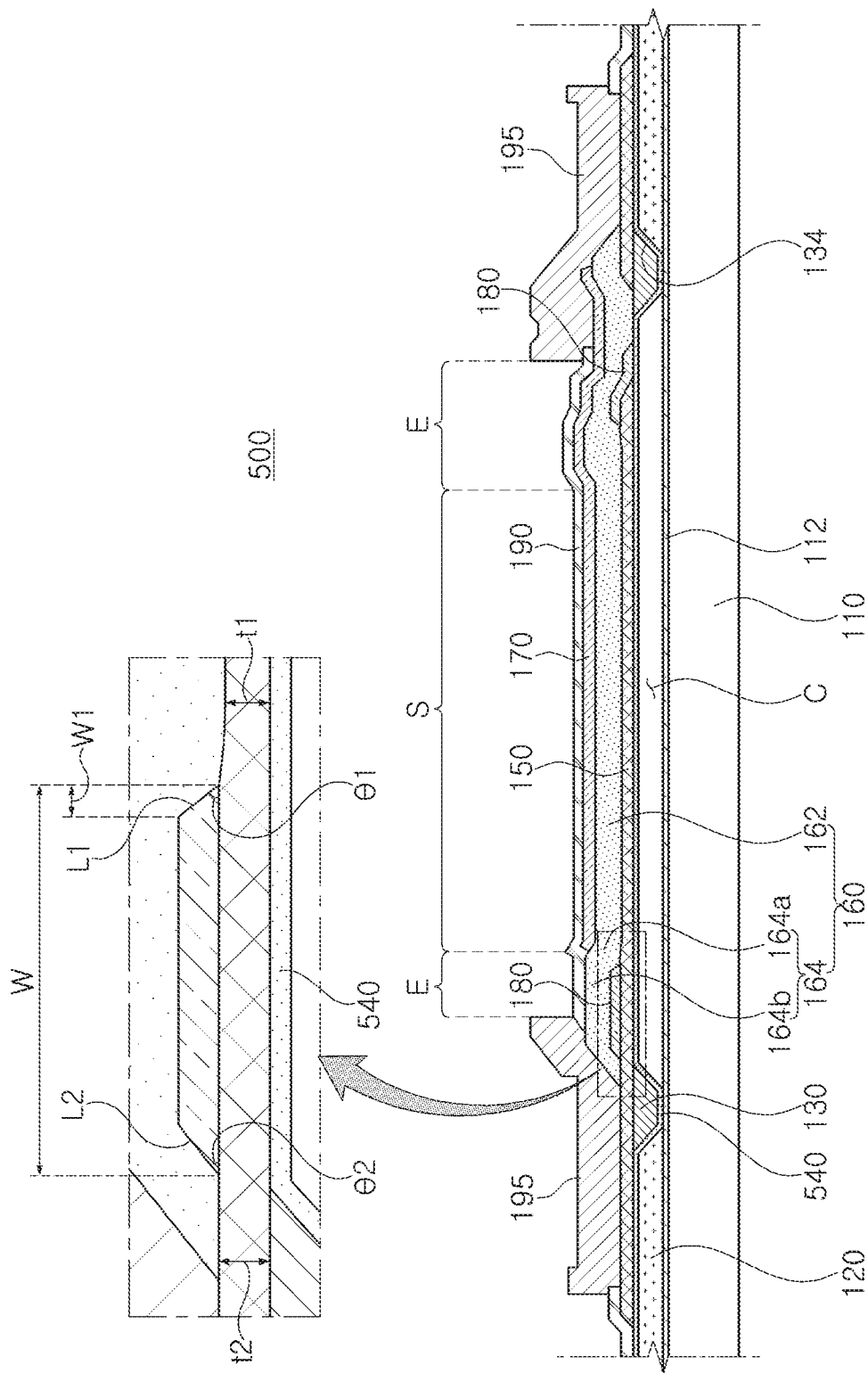
FIG. 8 is a cross-sectional diagram illustrating a bulk acoustic resonator, according to an embodiment.

FIG. 8 is a cross-sectional diagram illustrating a bulk acoustic resonator 500, according to an embodiment.

Referring to FIG. 8, the bulk acoustic resonator 500 may include, for example, a substrate 110, a sacrificial layer 120, an etch stop portion 130, a membrane layer 540, a first electrode 150, a piezoelectric layer 160, a second electrode 170, an insertion layer 180, a passivation layer 190, and a metal pad 195.

The substrate 110, the sacrificial layer 120, the etch stop portion 130, the first electrode 150, the piezoelectric layer 160, the second electrode 170, the insertion layer 180, the passivation layer 190, and the metal pad 195 are the same as in the embodiment of FIGS. 1-4, and the detailed descriptions thereof will thus not be repeated.

The membrane layer 540 may form a cavity C with the substrate 110. The membrane layer 540 may also be formed of a material having low reactivity with an etching gas when the sacrificial layer 120 is removed. The etch stop portion 130 may be inserted and disposed in a groove portion 134 formed by the membrane layer 540. A dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) may be used as the membrane layer 540, for example.

A seed layer (not illustrated) formed of aluminum nitride (AlN) may be formed on the membrane layer 540. The seed layer may be disposed between the membrane layer 540 and the first electrode 150. The seed layer may be formed using a dielectric material or a metal having an HCP crystalline structure, instead of aluminum nitride (AlN). As an example, in an example in which the seed layer is a metal, the seed layer may be formed of titanium (Ti).

According to the embodiments described herein, an effect of reducing insertion loss may be obtained.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. In addition, respective embodiments may be combined with each other. For example, the pressing members disclosed in the above-described embodiments may be used in combination with each other in one force sensing device. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic resonator, comprising:
    a substrate;
    a first electrode disposed on the substrate;
    a piezoelectric layer disposed to cover at least a portion of the first electrode;
    a second electrode disposed to cover at least a portion of the piezoelectric layer; and
    an insertion layer disposed below a partial region of the piezoelectric layer,
    wherein a thickness of the first electrode in an active region in which the first electrode, the piezoelectric layer, and the second electrode overlap one another is less than a thickness of a region outside the active region, and
    wherein an angle of inclination of an internal side surface of the insertion layer is different from an angle of inclination of an external side surface of the insertion layer.

2. The bulk acoustic resonator of claim 1, wherein a width of the insertion layer is 20 μm or less.

3. The bulk acoustic resonator of claim 1, wherein the angle of inclination of the internal side surface of the insertion layer is 15° to 25°.

4. The bulk acoustic resonator of claim 1, wherein the angle of inclination of the internal side surface of the insertion layer is greater than the angle of inclination of the external side surface of the insertion layer.

5. The bulk acoustic resonator of claim 1, wherein the insertion layer is formed of any one of silicon oxide (SiO2), aluminum nitride (AlN), aluminum oxide (Al2O3), silicon nitride (Si3N4), manganese oxide (MgO), zirconium oxide (ZrO2), lead zirconate titanate (PZT), gallium arsenide (GaAs), hafnium oxide (HfO2), titanium oxide (TiO2), and zinc oxide (ZnO).

6. The bulk acoustic resonator of claim 1, further comprising:
    an etch stop portion disposed between the substrate and the first electrode, and disposed around a cavity.

7. The bulk acoustic resonator of claim 6, further comprising:
    a sacrificial layer disposed around the etch stop portion.

8. The bulk acoustic resonator of claim 1, further comprising:
    a passivation layer disposed in a region excluding a part of each of the first electrode and the second electrode and covering the first electrode and the second electrode; and
    a metal pad connected to areas of the first electrode and the second electrode exposed from the passivation layer.

9. The bulk acoustic resonator of claim 1, further comprising:
    a membrane layer forming a cavity with the substrate and including a portion of the first electrode disposed on the membrane layer.

10. The bulk acoustic resonator of claim 9, wherein the membrane layer includes a seed layer formed of aluminum nitride (AlN).

11. The bulk acoustic resonator of claim 1, wherein the insertion layer is disposed on the first electrode, and the piezoelectric layer comprises a curved portion disposed on the insertion layer and raised up to correspond to a thickness and shape of the insertion layer.

12. A filter device, comprising:
    a substrate;
    a first electrode disposed on the substrate;
    a piezoelectric layer disposed to cover at least a portion of the first electrode;
    a second electrode disposed to cover at least a portion of the piezoelectric layer;
    an insertion layer disposed below a partial region of the piezoelectric layer;
    an etch stop portion disposed between the substrate and the first electrode and disposed around a cavity;
    a sacrificial layer disposed around the etch stop portion;
    a passivation layer disposed in a region excluding a part of each of the first electrode and the second electrode and covering the first electrode and the second electrode;
    a metal pad connected to areas of the first electrode and the second electrode exposed from the passivation layer; and
    a cap forming an internal space with the substrate and coupled to the substrate by an adhesive layer,
    wherein a thickness of the first electrode in an active region in which the first electrode, the piezoelectric layer, and the second electrode overlap one another is less than a thickness of a region outside the active region, and
    wherein an angle of inclination of an internal side surface of the insertion layer is different from an angle of inclination of an external side surface of the insertion layer.

13. The filter device of claim 12, further comprising:
    an external connection electrode penetrating the substrate, and connected to the first electrode and the second electrode.

14. The filter device of claim 12, further comprising:
    an external connection electrode penetrating the cap and connected to the metal pad.

15. The filter device of claim 12, wherein a width of the insertion layer is 20 μm or less.

16. The filter device of claim 12, wherein the angle of inclination of the internal side surface of the insertion layer is 15° to 25°.

17. The filter device of claim 12, wherein the angle of inclination of the internal side surface of the insertion layer is greater than the angle of inclination of the external side surface of the insertion layer.

18. The filter device of claim 12, wherein the insertion layer is formed of any one of silicon oxide (SiO2), aluminum nitride (AlN), aluminum oxide (Al2O3), silicon nitride (Si3N4), manganese oxide (MgO), zirconium oxide (ZrO2), lead zirconate titanate (PZT), gallium arsenide (GaAs), hafnium oxide (HfO2), titanium oxide (TiO2), and zinc oxide (ZnO).

19. The filter device of claim 12, wherein the insertion layer is disposed on the first electrode, and the piezoelectric layer comprises a curved portion disposed on the insertion layer and raised up to correspond to a thickness and shape of the insertion layer.

* * * * *